United States Patent [19]
Li et al.

[11] Patent Number: 6,080,241
[45] Date of Patent: Jun. 27, 2000

[54] CHEMICAL VAPOR DEPOSITION CHAMBER HAVING AN ADJUSTABLE FLOW FLANGE

[75] Inventors: Tingkai Li, Vancover, Wash.; Dane C. Scott, Doylestown, Pa.; Brian Wyckoff, Lambertville, N.J.

[73] Assignee: Emcore Corporation, Somerset, N.J.

[21] Appl. No.: 09/146,224

[22] Filed: Sep. 2, 1998

[51] Int. Cl.[7] .................................................. C23C 16/00
[52] U.S. Cl. ........................... 118/715; 118/723; 118/729
[58] Field of Search ................................... 118/715, 723, 118/729; 437/4

[56] References Cited

U.S. PATENT DOCUMENTS

| | | | |
|---|---|---|---|
| 4,751,192 | 6/1988 | Hirooka et al. | 437/4 |
| 4,756,272 | 7/1988 | Kessler et al. | 118/715 |
| 4,803,948 | 2/1989 | Nakagawa et al. | 118/725 |
| 4,928,626 | 5/1990 | Carlson et al. | |
| 4,950,156 | 8/1990 | Philipossian. | |
| 4,961,399 | 10/1990 | Frijlink. | |
| 4,980,204 | 12/1990 | Fujii et al. | 427/255.2 |
| 4,993,358 | 2/1991 | Mahawili. | |
| 4,997,677 | 3/1991 | Wang et al. | |
| 5,000,113 | 3/1991 | Wang et al. | 118/723 |
| 5,170,991 | 12/1992 | Heil | 251/214 |
| 5,264,039 | 11/1993 | Gobush et al. | |
| 5,399,200 | 3/1995 | Stauffer. | |
| 5,405,444 | 4/1995 | Moslehi. | |
| 5,425,810 | 6/1995 | Conti et al. | |
| 5,772,773 | 6/1998 | Wytman | 118/729 |
| 5,785,796 | 7/1998 | Lee | 156/345 |

FOREIGN PATENT DOCUMENTS

| | | |
|---|---|---|
| 0 687 749 B1 | 9/1998 | European Pat. Off. . |
| 60-223133 | 11/1985 | Japan . |
| 2-290972 | 11/1990 | Japan . |
| 4-137522 | 5/1992 | Japan . |

OTHER PUBLICATIONS

Hitchman et al., "Chemical Vapor Deposition. Principles and Applications," Academic Press, 1993; pp. 60–61, 72–73, 94–97.

Tompa et al., "Design and Applications of Large Area RDRs," III–Vs Review, vol. 7, No. 3, 1994; pp. 12–17.

*Primary Examiner*—Thi Dang
*Assistant Examiner*—Norca L. Torres
*Attorney, Agent, or Firm*—Lerner, David, Littenberg, Krumholz & Mentlik, LLP

[57] ABSTRACT

A chemical vapor deposition (CVD) reactor for growing epitaxial layers on wafers includes a chamber having an interior region and exterior region. The chamber includes one or more apertures extending therethrough for passing reactant gases from the exterior region of the chamber to the interior region of the chamber. The CVD reactor also includes one or more reactant gas injectors which are releasably secured to the one or more apertures in the chamber. Each reactant gas injector includes one or more passageways for passing reactant gas through the apertures in the chamber and into the interior region of the chamber. At least one of the injectors is releasably secured to the apertures so that the injector(s) may be removed from the aperture(s) of the chamber without entering the interior region of the chamber.

33 Claims, 17 Drawing Sheets

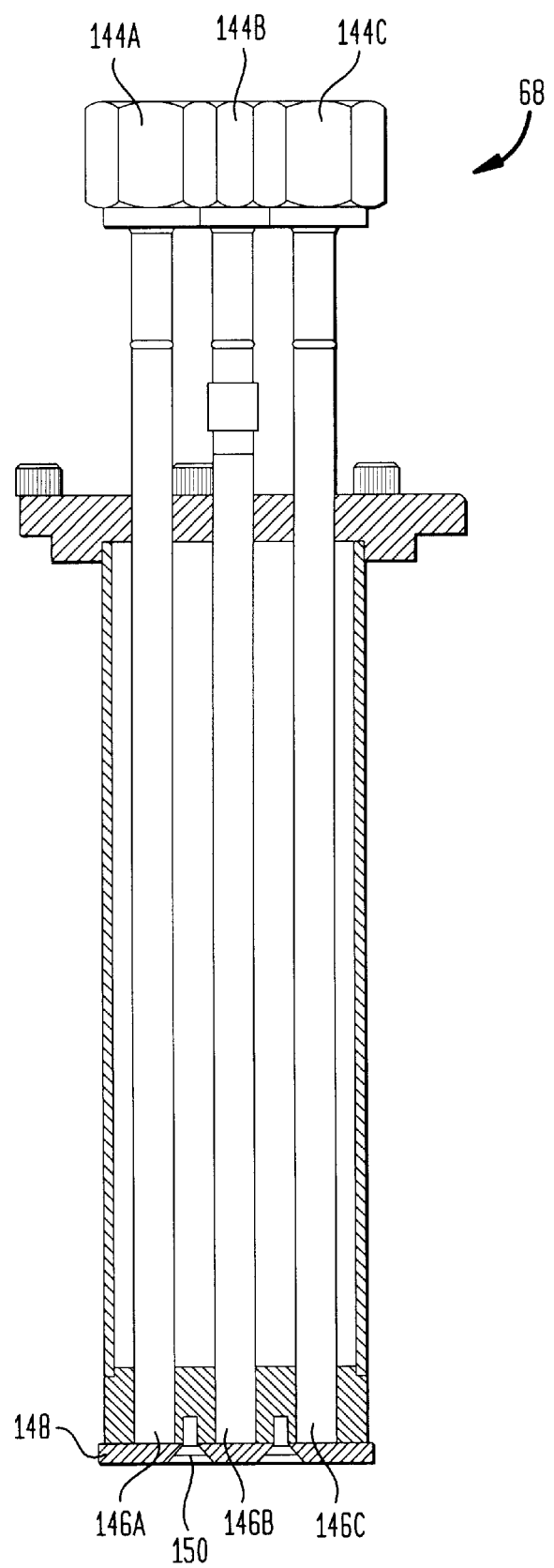

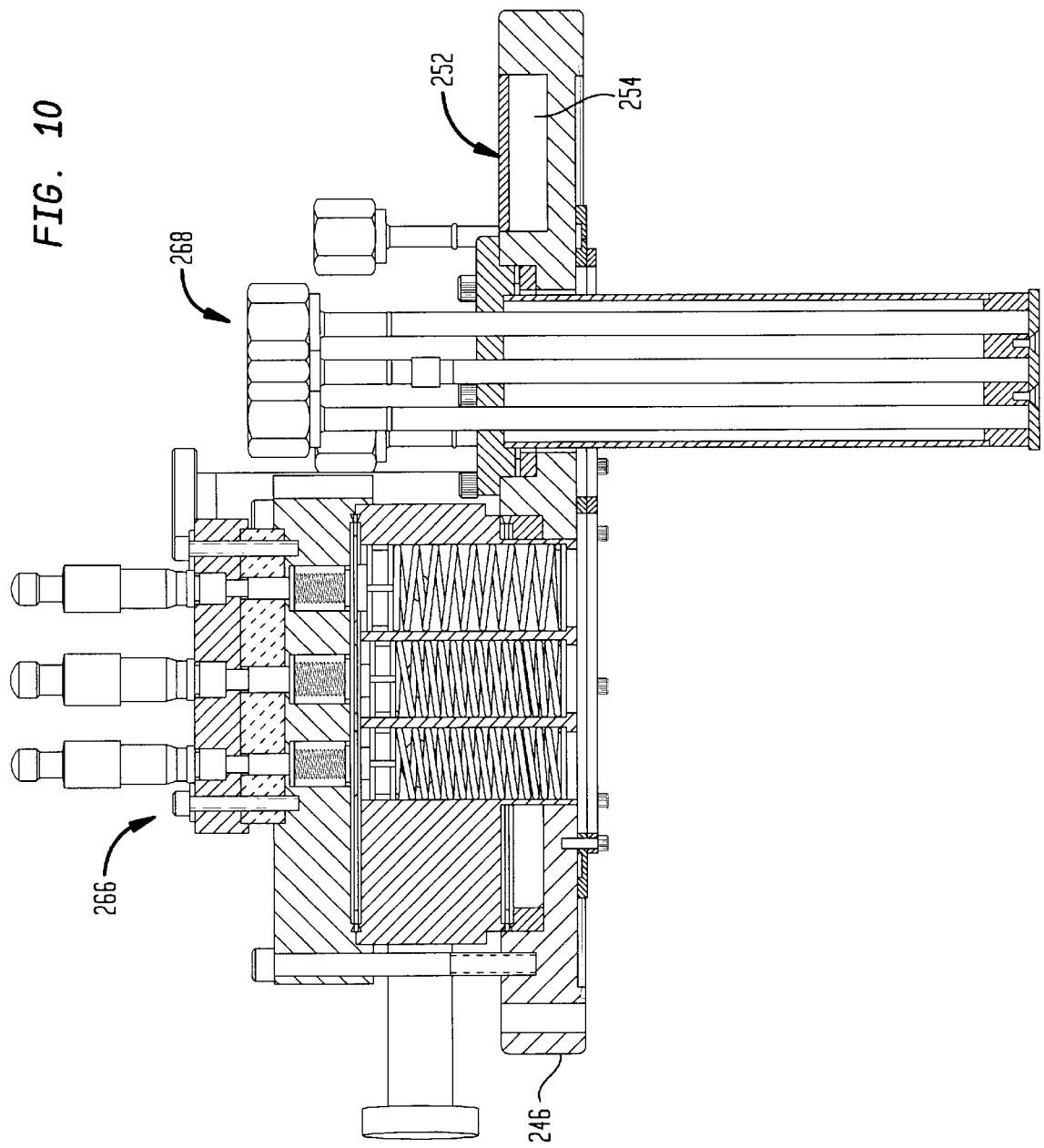

6,080,241

CHEMICAL VAPOR DEPOSITION CHAMBER HAVING AN ADJUSTABLE FLOW FLANGE

FIELD OF THE INVENTION

The present invention relates to chemical vapor deposition (CVD) reactors for growing epitaxial layers over substrates and more particularly relates to CVD reactors having one or more releasably secured reactant gas injectors which may be removed from the reactor and replaced with other injectors for modifying the flow path of the reactant gases.

BACKGROUND OF THE INVENTION

Microelectronic elements such as semiconductor chips are frequently manufactured by placing semiconductor wafers within a vacuum chamber of a chemical vapor deposition (CVD) reactor and then depositing layers of material on the wafers. During this process, one or more wafers are placed within the vacuum chamber and reactant chemicals in gaseous form are caused to flow over the wafers in controlled quantities and at controlled rates so that an epitaxial layer is grown on the surface of the wafer.

The reactant chemicals, frequently called precursors, are typically delivered to the vacuum chamber by placing the reactant chemicals in a device known as a bubbler and then passing a carrier gas through the bubbler. The carrier gas picks up molecules of the reactant chemicals as the gas passes through the bubbler to provide a reactant gas. The bubbler may include adjustable controls for modifying the concentration of the reactant chemicals in the carrier gas. The reactant gas is then fed to the CVD reactor thorough a mass flow controller which, in turn, delivers the reactant gas through associated plumbing to a flow flange and into the vacuum chamber.

CVD reactors have various designs, including horizontal reactors in which the wafer is mounted at an angle to the impinging reactant gases; horizontal reactors with planetary rotation in which the reactant gases pass across the wafers; barrel reactors; and recently, vertical high-speed rotating disk reactors in which the reactant gas is injected downwardly onto a substrate surface which is rotating within a reactor. These types of CVD reactors have been used successfully to grow a wide array of epitaxial layers, including various combinations of semiconductor thin-film devices and multi-layered structures such as lasers and LED's.

Vertical CVD reactors in which the wafers are located on a rotating disk include those shown in Hitchman et al., "Chemical Vapor Deposition. Principles and Applications," *Academic Press*, 1993; and Tompa et al., "Design and Application of Large Area RDRs," *III-Vs Review*, vol. 7, no. 3, 1994. In these reactors, various techniques have been disclosed for providing a uniform flow of reactant gases over wafers. These include the use of a fine wire mesh, such as that shown in Wang et al., U.S. Pat. No. 4,997,677. In the '677 patent, the reactant gases are mixed in an antechamber before being passed through a fine stainless steel wire mesh. As such, the reactant gases chemically interact in the antechamber before being introduced into the reactor chamber. However, in certain applications the chemical interaction of the reactant gases may be undesirable because the gases may prematurely react before they reach the wafer. In order to avoid these problems, antechambers have been divided into segments for each reactant gas, as disclosed in the above-identified Tompa reference and in European Patent No. 687,749. In the '749 patent, separate parallel chambers are provided in separate planes for carrying separate reactant gases which are fed through individual conduits and into the reactor chamber. Premature reaction may nevertheless occur in such systems after the reactant gases are introduced into the vacuum chamber and/or during flow of the gases to the wafer.

The conditions or parameters under which the reactant gases are introduced into the vacuum chamber have a dramatic affect upon the characteristics of the epitaxial layers grown on the wafers. These parameters include material viscosity, density, vapor pressure, the flow path of the reactant gases, chemical activity and/or temperature. During research and development efforts directed to growing new types of epitaxial layers, researchers frequently modify the above-identified parameters and study the effects of such modification, in order to optimize the quality of the epitaxial layers grown on the wafers. One parameter which is frequently altered during research and development efforts is the flow path of the reactant gases. For example, the flow path of the gases may be modified by changing the design of the flow flange used to introduce the gases into the chambers. The researchers then study the epitaxial layer grown on the wafer to determine the optimum flow path for growing a particular type of layer. During this trial and error process, the flow flange is continuously modified until the best flow path for a particular type of epitaxial layer is identified.

Current flow flange designs introduce the reactant gases into the vacuum chamber at a single height. However, when growing certain types of epitaxial layers (e.g., epitaxial layers including oxides) the reactant gases must be maintained separately from one another until they reach, or just prior to reaching, the surface of the wafer. Thus, the introduction of reactant gases at a single height above the wafer may result in a premature chemical reaction taking place away from the wafer. Such a reaction, if allowed to commence too far from the wafer, typically results in the production of an inferior epitaxial layer. On the other hand, if the reactant gases are separated from one another for too long a period of time, then the reactant gases may not have sufficient time to fully react with one another before reaching the wafer. This will also result in the growth of inferior epitaxial layers. Thus, there is a need for a CVD reactor having an adjustable flow flange so that during the development of new growth systems, researchers may easily modify the flow path used to introduce the reactant gases into the vacuum chamber.

It is another object of the invention to provide an apparatus for delivering reactant gases at different distances from the wafers.

It is yet another object of the invention to provide a CVD reactor which can control the ratio of reactant chemicals flowing to different areas of the growth chamber without the use of needle valves or mass flow controllers.

It is still another object of the invention to provide a CVD reactor which allows for the rapid change of flow patterns for each of the reactant gases.

It is still a further object of the invention to provide a CVD reactor that creates a curtain of inert gas around the inner walls of the vacuum chamber to shield the walls from the reactant gases and to urge the reactant gases to move downwardly toward the wafer.

SUMMARY OF INVENTION

In one preferred embodiment of the present invention, a chemical vapor deposition (CVD) reactor includes a vacuum chamber having one or more walls defining an interior region located inside the chamber and an exterior region located outside the chamber. The one or more walls preferably include one or more apertures extending therethrough for passing reactant gases from the exterior region of the chamber to the interior region of the chamber. The term reactant gases is meant to include gases and vapors existing at conditions prevailing within the vacuum chamber, and may include gases introduced into the chamber at elevated temperatures and reduced pressures. The reactant gases may be diluted by introducing another inert gas therein. The CVD reactor also includes one or more reactant gas injectors for introducing the reactant gas into the interior region of the chamber. The one or more reactant gas injectors are preferably releasably secured to the one or more apertures in the walls of the chamber so that the injectors may be easily removed from the chamber and replaced with other reactant gas injectors. The replaceable nature of the gas injectors is particularly beneficial during research and development efforts when researchers seek to determine the optimum flow path for introducing reactant gases into the vacuum chamber and over the wafers placed therein. Each gas injector preferably includes one or more passageways for passing the reactant gas from the exterior region of the chamber, through the apertures in the walls of the chamber and into the interior region thereof. At least one of the gas injectors may be selectively unsecured and/or removed from the apertures without entering into the interior region of the chamber. In other words, the CVD reactor is designed so that the gas injectors are removable from outside the chamber and without entering inside of the chamber. This feature is particularly beneficial because the injectors can be replaced without cooling down the chamber and without the risk of contaminating the interior region of the chamber.

The CVD reactor may include a substrate carrier which is mounted within the interior region of the chamber. The substrate carrier desirably includes a first surface having a growth area for receiving one or more wafers. The substrate carrier is preferably mounted for rotation within the interior region of the chamber so that the one or more wafers may be rotated while the reactant gases are introduced into the interior region of the chamber and atop the wafers. In certain embodiments, the substrate carrier is rotatably mounted for rotating in a substantially horizontal plane. In other embodiments, the substrate carrier rotates within a substantially vertical plane. In yet further embodiments, the substrate carrier may rotate within any plane lying between the horizontal and vertical axes.

The growth area on the first surface of the substrate carrier preferably faces the gas injectors so that the reactant gases may be introduced directly above the growth area. In one preferred embodiment, the CVD reactor includes a first gas injector overlying a first region of the growth area and a second gas injector overlying a second region of the growth area. In this embodiment, the first gas injector at least partially overlies a central region of the growth area and the second gas injector at least partially overlies a peripheral region of the growth area lying outside the central region. In further preferred embodiments, the CVD reactor may include three, four or even more releasably secured reactant gas injectors.

In other preferred embodiments, the CVD reactor may include a first gas injector adapted for introducing a reactant gas at a first distance from the growth area and a second gas injector adapted for introducing a reactant gas at a second distance from the substrate carrier. In other words, the outlet ports of the first and second gas injectors introduce their respective gases into the interior region of the CVD reactor at different heights above the growth area so as to optimize the chemical reaction which takes place at the wafer. This particular design prevents the occurrence of a premature chemical reaction between the reactant gases. When using certain types of reactant gases, when the gases are introduced at the same height above the wafer, the reactant gases may prematurely interact. This premature reaction may result in the growth of defective epitaxial layers on the wafers. The removable gas injectors may be easily replaced with other gas injectors having different flow characteristics until a combination of injectors is identified which produce superior epitaxial layers.

In one preferred embodiment, the external walls of the chamber define a substantially cylindrical body having a circular opening at a top portion thereof and a flow flange is secured atop the cylindrical body. The flow flange has a disk-shaped portion with an outer periphery which substantially conforms to the circular opening. A sealing element may be positioned between the body and the flow flange for forming an air-tight seal between the flow flange and the cylindrical body. The sealing element may include a peripheral groove cut into an interior surface of the flow flange and a flexible sealing gasket fitted within the groove. The peripheral groove and the sealing gasket preferably have an annular configuration so that the flexible sealing gasket overlies the outer perimeter of the circular opening when the flow flange is secured atop the chamber.

The CVD reactor may also include one or more elements in thermal communication therewith for cooling and/or heating the reactant gases as the gases are passed through the gas injectors. As mentioned above, heating or cooling of the reactant gases may be desirable in certain processes for optimizing the quality of the epitaxial layer grown on the wafer. In one preferred embodiment, the flow flange includes a hollow portion formed therein and has a jacket or pocket fitted into the hollow portion for containing cooling fluid. The jacket substantially surrounds portions of the gas injectors so that when the reactant gas is passed through the gas injectors the cooling fluid transfers heat to the reactant gases for cooling the reactant gases to a preferred temperature. In other preferred embodiments, the CVD reactor may include one or more heating elements in thermal communication with one or more of the gas injectors for heating the reactant gases to a preferred temperature.

In certain preferred embodiments, the flow flange includes a top surface facing the exterior region of the vacuum chamber and a bottom surface facing the interior region of the chamber with one or more apertures extending therethrough. At least one of the apertures in the flow flange is a complex aperture having a first opening at the top surface of the flow flange with a first diameter, whereby the first opening extends partially through the flow flange toward the bottom surface of the base flange. The first opening terminates at an intermediate region of the flow flange located between the top and bottom surfaces thereof. The complex aperture also preferably includes a second opening commencing at the intermediate region of the first opening and extending to the bottom surface of the flow flange. The second opening has a second diameter which is smaller than the diameter of the first opening. After the second opening has been formed, the intermediate region of the first opening which remains between the top and bottom surfaces of the flow flange surrounds the perimeter of the second opening and defines a shelf. A sealing element, such as a sealing gasket, may be placed over the shelf for forming an air-tight seal between the aperture and a gas injector. The sealing element may have an outer periphery which extends to and abuts against the outer periphery of the first opening.

When one of the gas injectors is inserted through the first complex aperture, a flange portion of the gas injector, abuts against the sealing gasket provided atop the shelf for forming an air-tight seal between the gas injector and the flow flange. The flow flange may also include one or more additional complex apertures for receiving other releasably secured gas injectors. Thus, the flow characteristics may be continuously modified by replacing one or more of the gas injectors with other gas injectors having different flow characteristics.

BRIEF DESCRIPTION OF THE DRAWINGS

FIG. 8 shows a cross-sectional view of one of the gas injectors shown in FIG. 5.

FIG. 10 shows a cross-sectional view of a flow flange including a cooling element in thermal communication therewith in accordance with further preferred embodiments of the present invention.

DETAILED DESCRIPTION OF PREFERRED EMBODIMENTS

Figure 1:
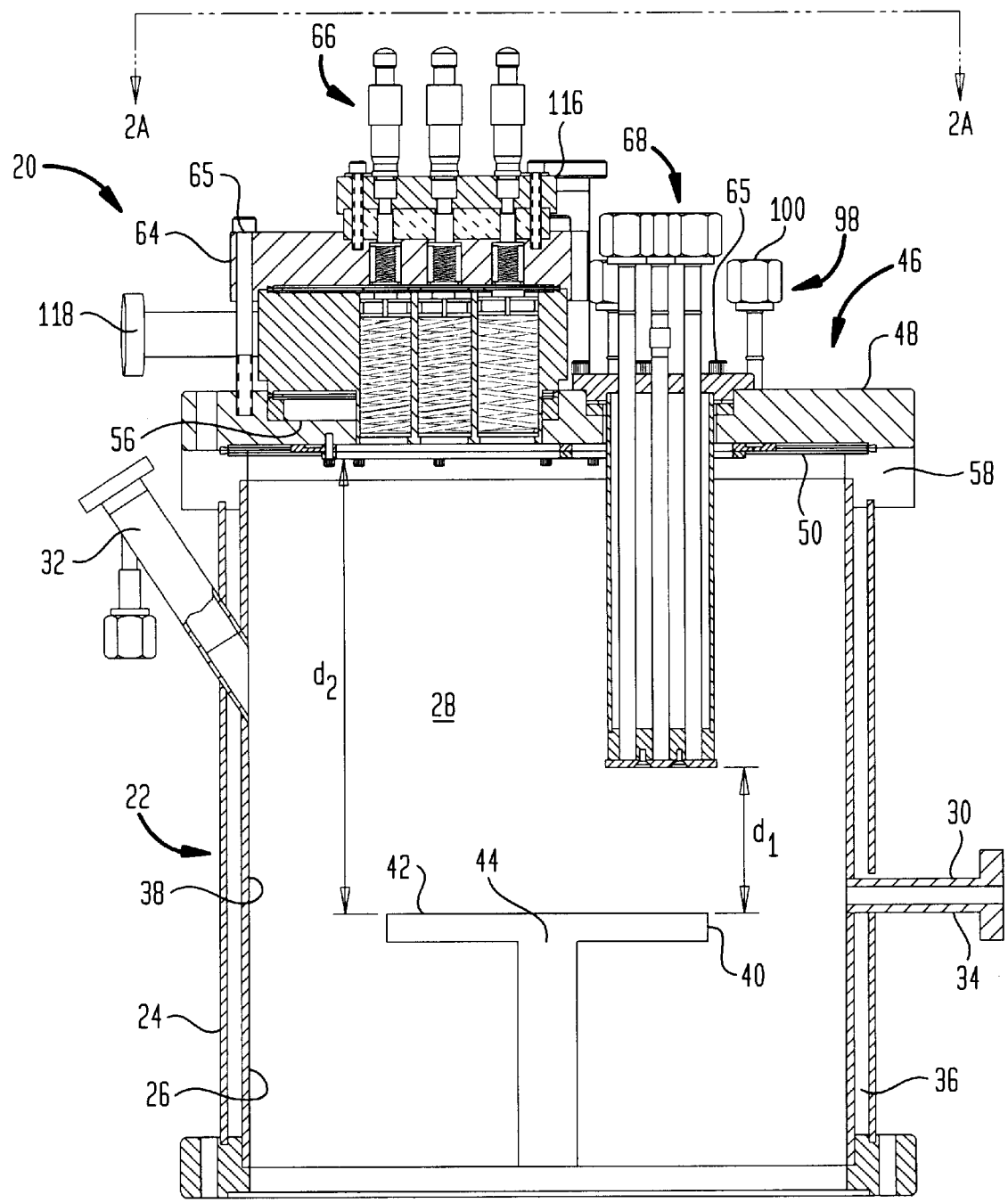
FIG. 1 shows a cross-sectional view of a chemical vapor deposition (CVD) reactor including reactant gas injectors releasably secured in a flow flange in accordance with one preferred embodiment of the present invention.

Referring to FIG. 1, in accordance with one preferred embodiment of the present invention, a chemical vapor deposition (CVD) reactor 20 includes a vacuum chamber 22 having a cylindrical body 24 with walls 26 comprising vacuum-grade stainless steel. The CVD reactor 20 includes an interior region 28 inside the walls 26 of the chamber 22 and an exterior region 30 lying outside the chamber 22. The reactor 20 includes a view port 32 for providing visual access to the interior region 28 of the chamber 22. The reactor may include an exhaust conduit (not shown) for removing exhaust gases from the interior region of the chamber. In certain embodiments, the exhaust conduit may extend from the bottom of the reactor. The cylindrical body 24 may also include a flange opening 34 connectable with a loading apparatus for inserting and removing wafers from the interior region 28 of the chamber 22 without exposing the chamber to the atmosphere of the exterior region. The CVD reactor 20 may include a cooling jacket 36 in thermal communication with the walls of the cylindrical body for use during deposition processes at extremely high temperatures as well a liner 38 covering the interior walls 26 of the chamber 22 to simplify cleaning and maintenance procedures for the reactor. The CVD reactor 20 preferably includes a substrate carrier 40 mounted for rotation within the interior region of the chamber. The rotatable substrate carrier 40 includes a top surface 42 having a growth area 44 for receiving one or more wafers. In certain embodiments, the substrate carrier 40 rotates within a substantially horizontal plane. However, in other embodiments the substrate carrier may rotate within a substantially vertical plane or within a plane lying between a horizontal plane and a vertical plane.

Figure 2A:
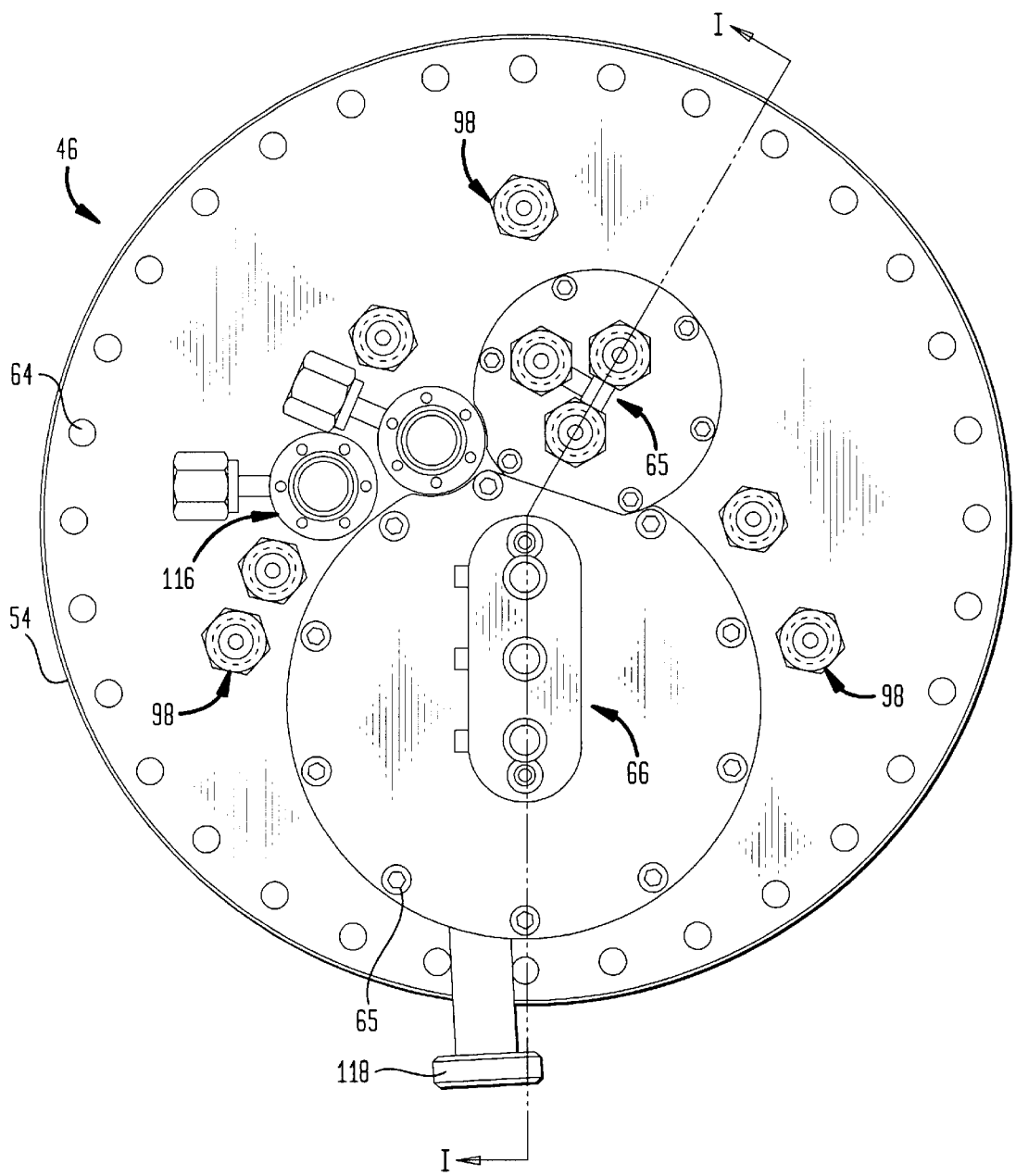
FIG. 2A shows a top view of a flow flange for a CVD reactor in accordance with certain preferred embodiments of the present invention.

Referring to FIGS. 1 and 2A, reactant gases are preferably introduced into the interior region 28 of the chamber 22 and over the growth area 44 through an adjustable flow flange 46. The flow flange 46 preferably has a top surface 48 facing the exterior region 30 of the chamber 22 and a bottom surface 50 facing the interior region 28 of the chamber 22 and one or more complex apertures 52 extending therethrough. The flow flange 46 is preferably disk shaped and has an outer periphery 54 which substantially conforms to the shape of a circular opening at the top 56 of the cylindrical body 24 so that when the flow flange 46 is secured to the chamber 22, the flow flange and chamber form an air-tight seal. The CVD reactor preferably includes a sealing element 58 for forming the air-tight seal between the cylindrical body 24 and the flow flange 46. The flow flange may also include a plurality of bores 64 adjacent the outer periphery 54 thereof so that bolts or screws 65 may be placed through the bores 64 for securing the flow flange 46 to the chamber 22. Once the flow flange 46 has been secured atop the cylindrical body 24 and an air-tight seal has been formed therebetween, the flow flange 46 may remain permanently secured to the chamber and need not be removed in order to remove and/or replace the gas injectors 66 and 68.

Figure 2B:
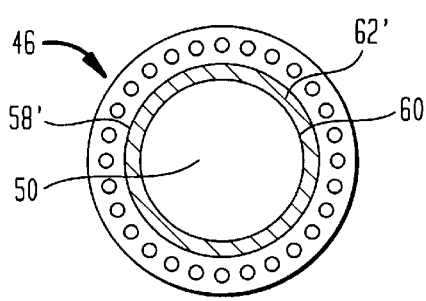
FIG. 2B shows a bottom view of the flow flange shown in FIG. 2A.

Referring to FIG. 2B, in one embodiment, the sealing element 58' comprises a peripheral groove 60' formed in the bottom surface 50 of the flow flange 46 and an annular gasket 62' or O-ring fitted within the peripheral groove 60'. In this particular embodiment, when the flow flange 46 is secured to the cylindrical body 24 the annular gasket 62' abuts against the top 56 of the body 24 to form an air-tight seal therewith.

Figure 3A:
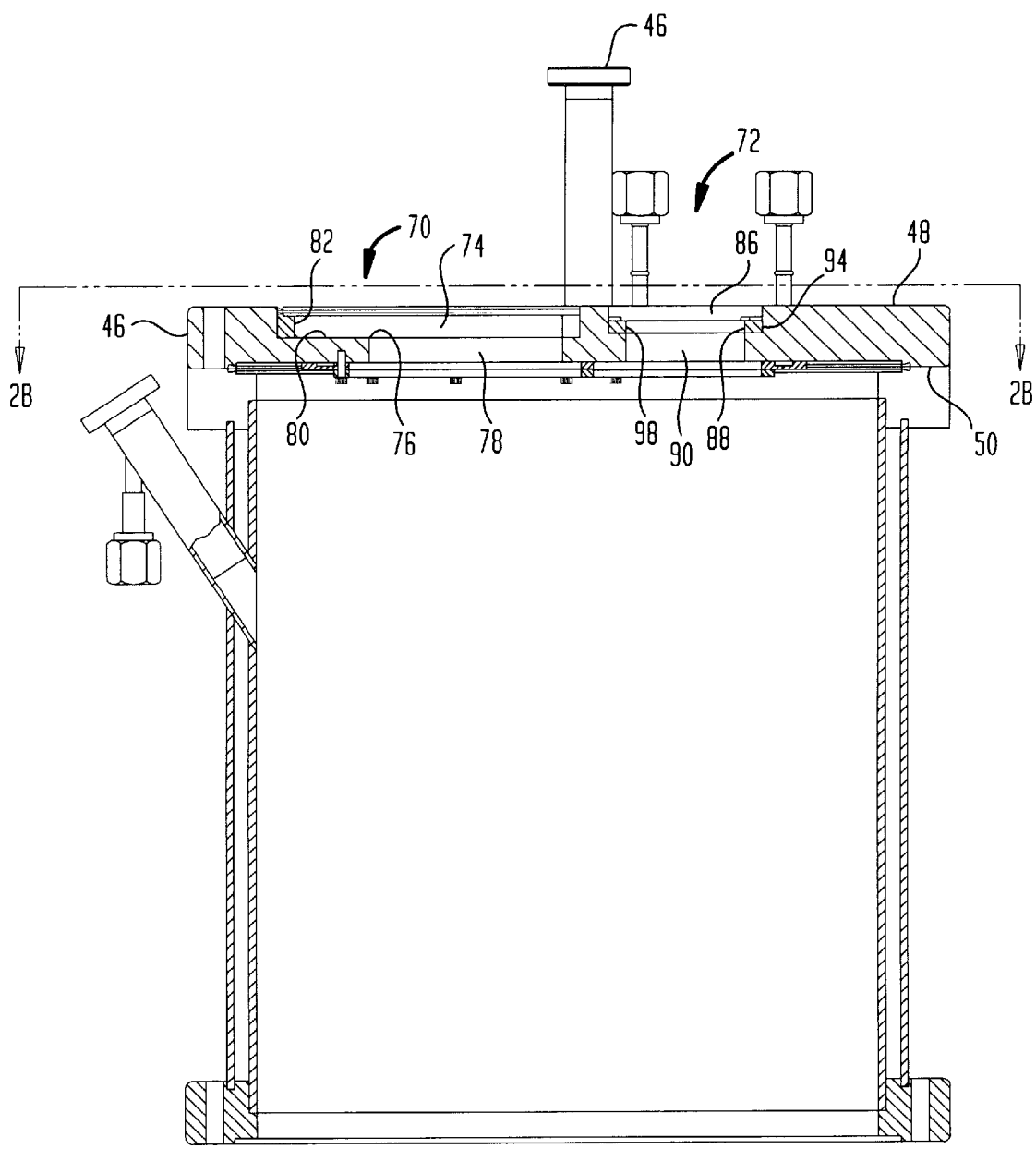
FIG. 3A shows a cross-sectional view of the CVD reactor of FIG. 1 with the gas injectors removed from the flow flange.
Figure 3B:
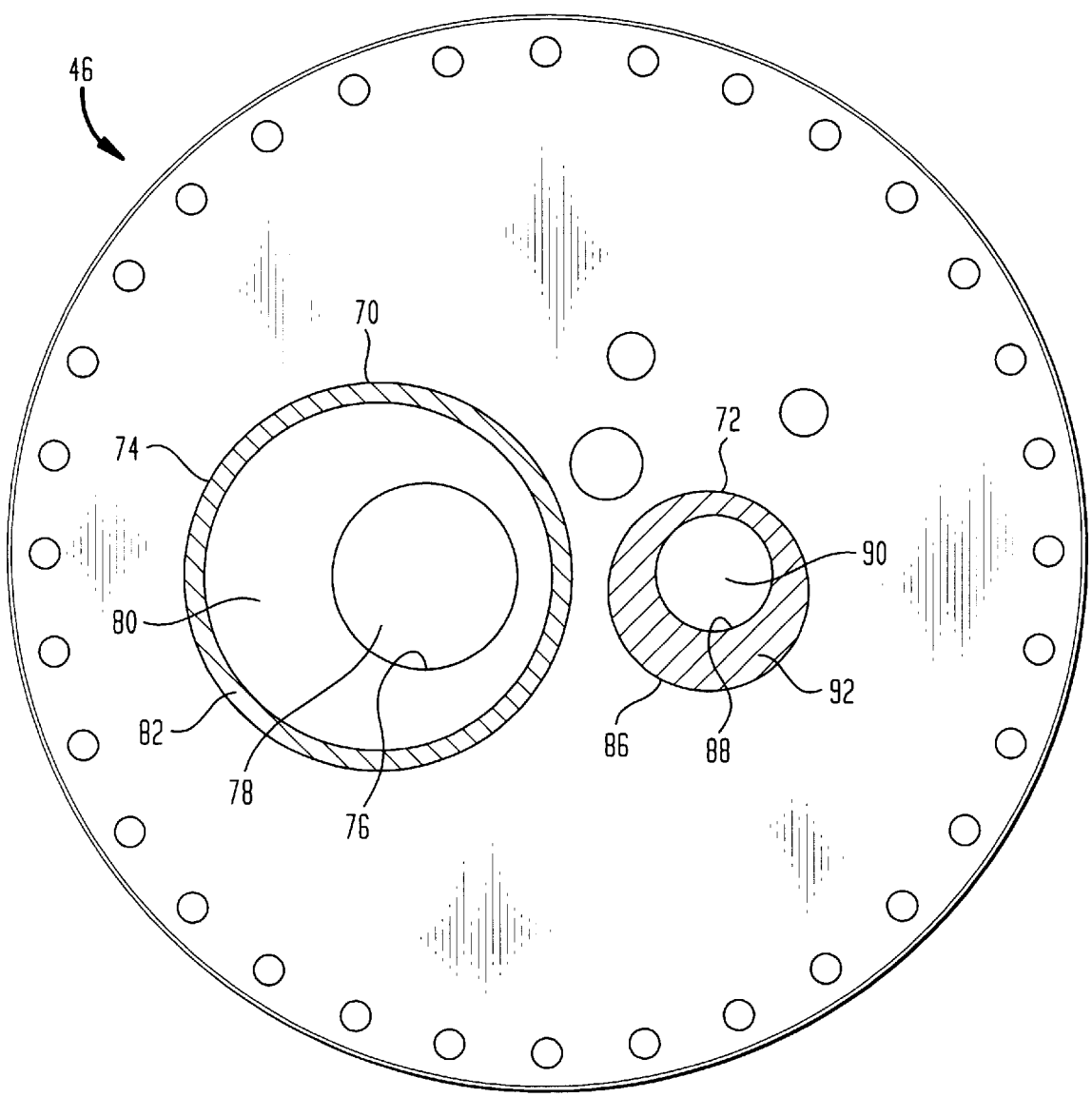
FIG. 3B shows a top view of the flow flange of the CVD reactor shown in FIG. 3A.

Referring to FIGS. 3A and 3B, the adjustable flow flange 46 includes two complex apertures 70 and 72 extending therethrough. The first complex aperture 70 includes a large diameter opening 74 at the top surface 48 of the flow flange 46 which extends partially through the width of the flow flange 46 and terminates at an intermediate portion 76 thereof. A second smaller diameter opening 78, not necessarily concentric to the large diameter opening 74, is bored into the intermediate portion 76 of the large diameter opening 74 and extends to the bottom surface 50 of the flow flange 46. The second smaller diameter opening 78 preferably has an annular shaped periphery and may have the shape of a circle or an oval. The intermediate portion 76 of the large diameter opening 74 which remains after the small diameter opening 78 has been formed therein provides a shelf 80 located between the top and bottom surfaces 48 and 50 of the flow flange 46. A flexible gasket 82 may be provided atop the shelf 80 so that an air-tight seal may be formed between the first gas injector 66 and the flow flange 46 when the first gas injector 66 is installed into the complex aperture 70. The second complex aperture 72 includes a large diameter opening 86 at the top surface 48 of the flow flange 46 which extends partially through the width of the flow flange 46 and which terminates at an intermediate portion 88 thereof. A second smaller opening 90 is bored into the large diameter opening 86 and extends to the bottom surface 50 of the flow flange 46. The second smaller opening 90 preferably has an annular shaped periphery such as a circle or an oval. The intermediate portion 88 defines a shelf 92 located between the top and bottom surfaces 48 and 50 of the flow flange 46. A flexible gasket 94 is provided atop the shelf 92 for forming an air-tight seal between the second gas injector 68 and the flow flange 46. The gas injectors 66 and 68 may be releasably secured to the flow flange using a wide variety of techniques. Referring to FIG. 2A, in one embodiment, threaded openings are bored at selected locations in the top surface of the flow flange and also through lateral flange portions of the gas injectors. Threaded bolts 65 are then screwed into the threaded bores so as to releasably secure the gas injectors 66 and 68 to the flow flange 46. In other embodiments, clamps or a wide variety of other securing elements may be used to releasably secure the injectors to the flow flange.

Figure 4:
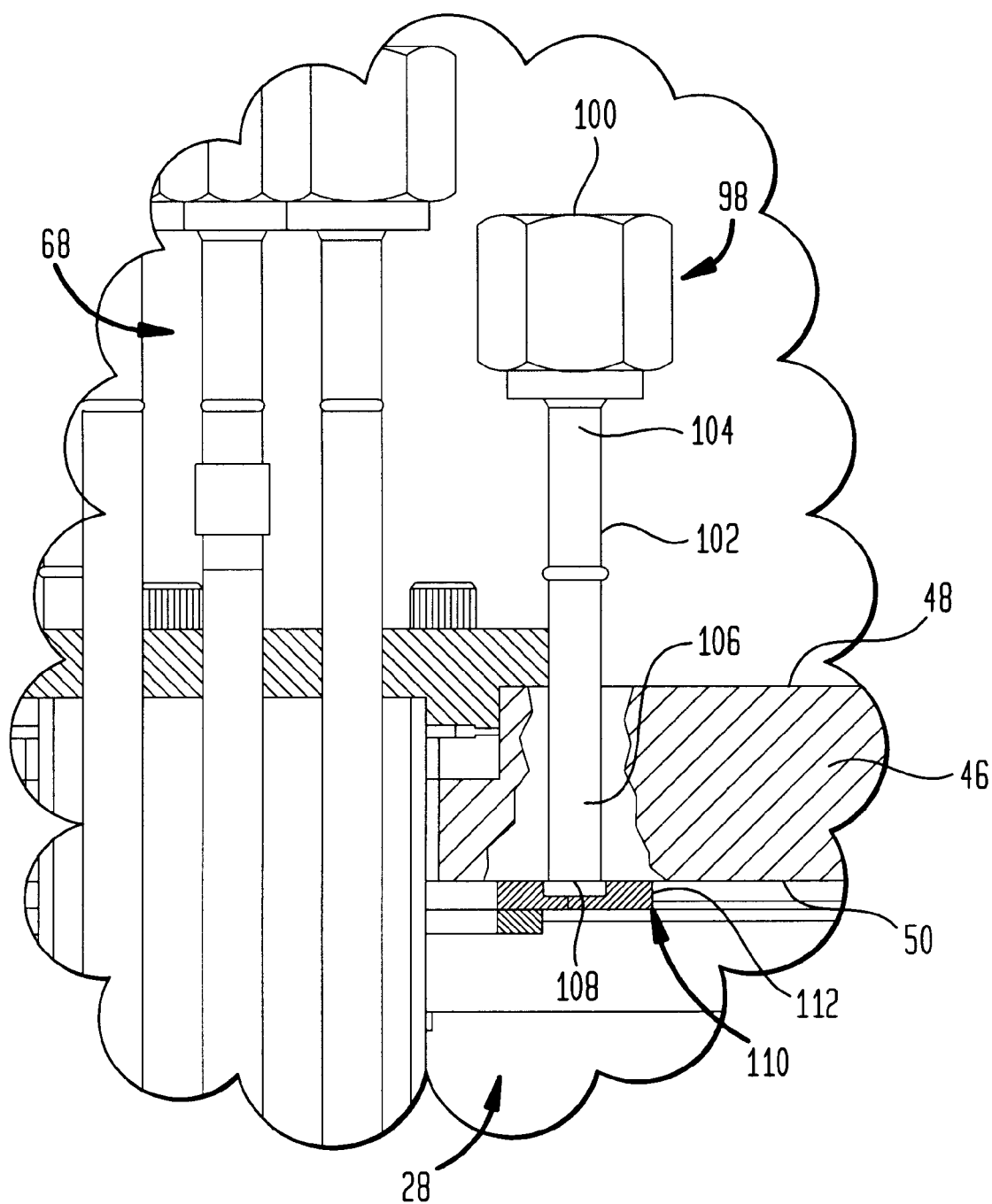
FIG. 4 shows a fragmentary detailed view of a flow flange including a curtain gas input port for introducing a curtain gas into an interior region of a CVD reactor in accordance with further preferred embodiments of the present invention.
Figure 5:
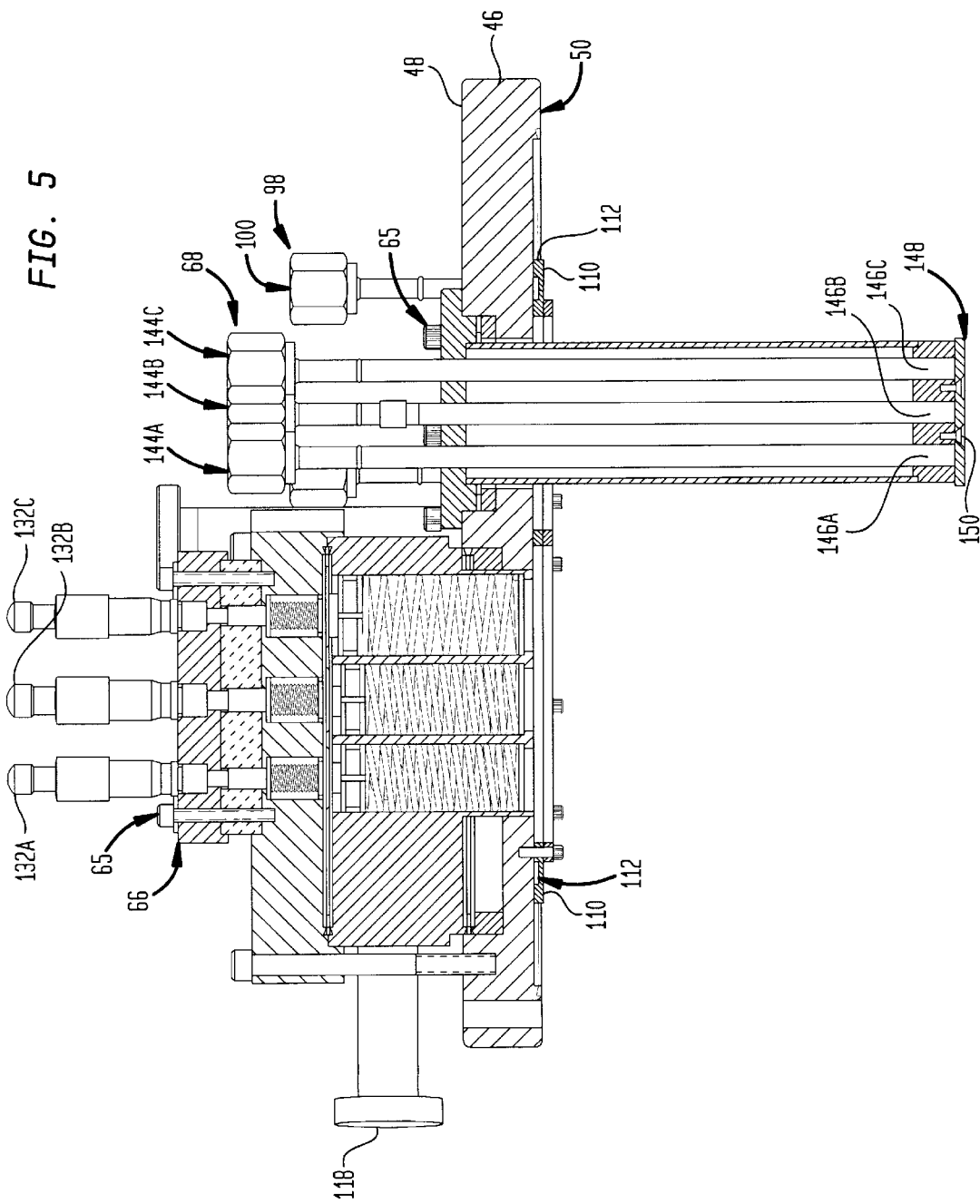
FIG. 5 shows a detailed view of the gas injectors and flow flange of FIG. 1.

Referring to FIGS. 4 and 5, the CVD reactor 20 preferably includes an additional injector 98 for introducing a curtain gas into the interior region 28 of the chamber. The curtain gas injector includes an input port 100 accessible at the top surface 48 of the flow flange 46 for receiving the curtain gas. The curtain gas injector also includes a conduit 102 having a first end 104 connected to the input port 100 and a second end 106 having an outlet 108 which opens into the interior region 28 of the chamber at the bottom surface 50 of the flow flange 46. A ring 110 is secured to the bottom surface 50 of the flow flange 46 and overlies the outlet port 108 of the curtain gas injector 98. Referring to FIGS. 1, 4 and 5, the ring is preferably concentric with the flow flange 46 and has a diameter which is relatively larger than the diameter of the substrate carrier 40. Upon feeding the carrier gas into the input port 100, the gas will pass through the conduit 102 and escape around the outside of the ring through a gap 112 between the flow flange 46 and the ring 110. The gaps 112 in the ring are located outside the periphery of the first and second reactant gas injectors 66 and 68 to provide a curtain of gas which maintains reactant gases within a region of the chamber overlying the substrate carrier 40 to form a curtain of gas which is concentric with the walls 26 of the chamber 24 and which shields the interior chamber walls 38 from reactant gases introduced into the chamber 22. The curtain gas preferably has a downward flow toward the growth area 44 which urges the reactant gases to flow downward toward wafers placed on the carrier substrate 40.

Referring to FIGS. 1 and 2A, the flow flange 46 also preferably includes one or more fill gas ports 114 for introducing fill gases into the interior region of the chamber 22 so as to fill void areas within the chamber, i.e. areas within the chamber which are not filled with the reactant gases or the curtain gases. The flow flange 46 may also include one or more view ports 116 which provide visual access into the interior region 28 of the chamber 22. Analytical devices may be positioned above the view ports 116 for collecting information about the nature and quality of the epitaxial layers grown within the chamber 22.

Figure 6:
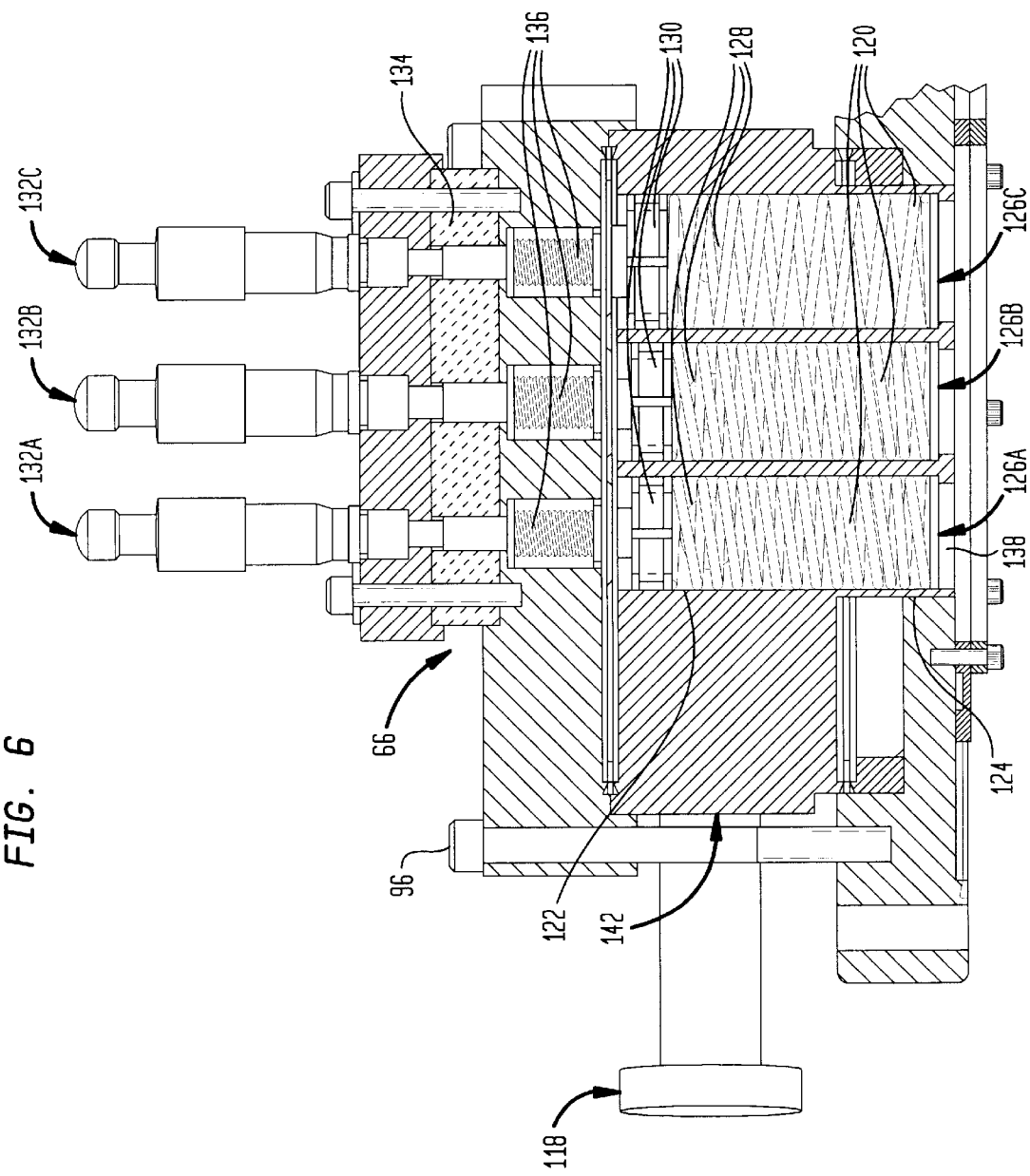
FIG. 6 shows a cross-sectional view of one of the gas injectors shown in FIG. 5.

Referring to FIGS. 1, 5 and 6, the first gas injector 66 preferably includes a single input port 118 for receiving one or more gases. The first gas injector preferably overlies the growth area 44 of the substrate carrier 40 and more preferably overlies a radial distance from slightly outside the center of the growth area 44 to slightly beyond the perimeter of the growth area. Referring to FIG. 6, the first injector 66 includes flow chambers 120 having first ends 122 in fluid communication with the input port 118 and second ends 124 in communication with outlet ports 126. The flow chambers 120 are preferably connected to the input port via bores 128 formed in walls of the flow chambers 120. The amount of reactant gas which flows into the flow chambers 120 may be controlled by adjustable slides 130 which are installed adjacent the bores 128 in such a manner that they may selectively cover the bores 128 and close off the fluid communication between the input port 118 and the flow chambers 120. The slides are controlled by micrometer screw devices 132A, 132B and 132C which may be rotated to enlarge or reduce the size of the bores 128. For example, the gas flow into the flow chambers 120 may be increased by enlarging the size of the bores 128. The slides 130 are preferably sealed from the external atmosphere by bellows 134. Springs 136 may be provided in contact with the slides 130 and against the force of the micrometer screwing devices 132A–132C for urging the slides 130 to remain in the open position.

Figure 7A:
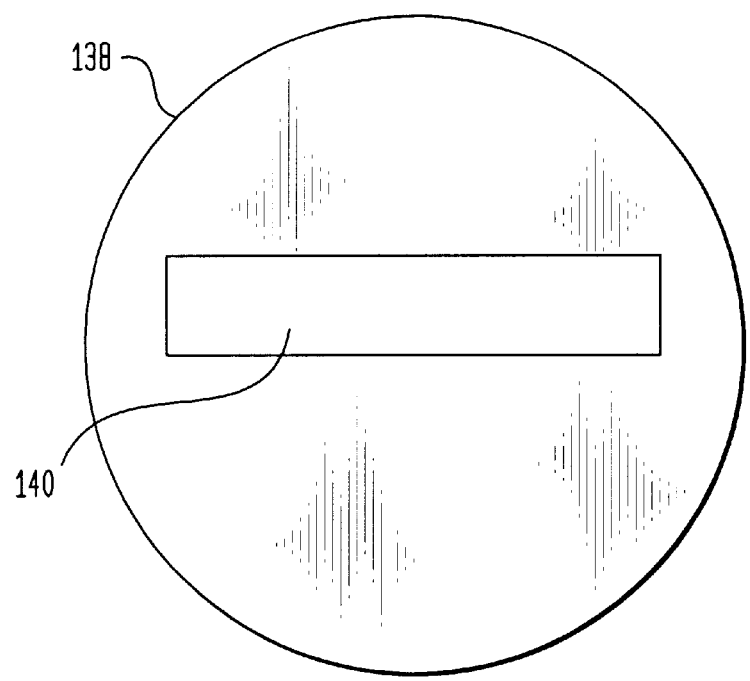
FIG. 7A shows a disk having an opening used to modify reactant gases flowing from the gas injector of FIG. 6 in accordance with one preferred embodiment of the present invention.
Figure 7B:
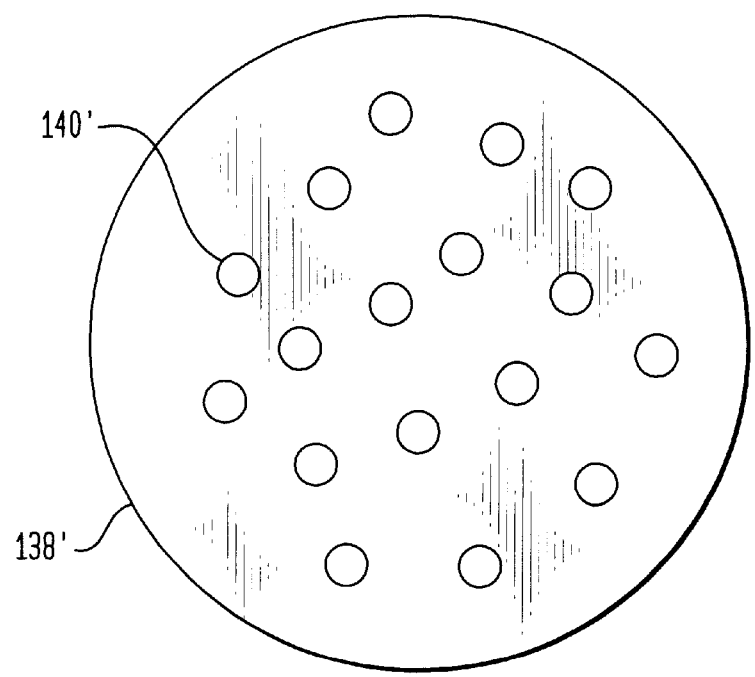
FIG. 7B shows a disk having a plurality of openings used to modify reactant gases flowing from the gas injector of FIG. 6 in accordance with further preferred embodiments of the present invention.

The first gas injector has three outlets ports 126A–126C spaced along the radius, with the flow of the reactant gas from each outlet port 126A–126C being directed vertically downward toward the growth area 44. The specific shape of the flow stream from each outlet port 126A–126C may be further modified by providing one or more disks 138 over the outlet ports. Each disk 138 typically has an opening 140 therein having a specific geometric shape. As shown in FIG. 7A, the disks 138 may have a single slot 140 for generating a rectangular flow stream. The disks 138' may also have a plurality of openings 140' for generating multiple small round flow streams, as shown in FIG. 7B. The disks 138 may be readily removed and replaced with other disks having openings of other shapes when it is desirable to modify the shape of the flow stream.

Referring to FIG. 6, during operation of the CVD reactor, the flow of reactant gases through the first gas injector 66 may be modified by, inter alia, altering the size of the bores 128 in the flow chambers 122, altering the shape or design of the flow chambers 122, and/or modifying the shape of the openings 140 in the disks 138 provided at the outlet port 126. The first gas injector 66 need not have three outlet ports. For example, in one embodiment the first gas injector 66 has one relatively thin, narrow outlet port. In further embodiments, the first gas injector has circumferential outlet ports of varying radii. In still further embodiments, the first gas injector may include additional bores formed in each flow chamber 122 to allow for the introduction of secondary gases into the flow stream prior to introduction of the reactant gases into the interior region of the chamber. The first gas injector 66 may also have one or more heating elements 142 in thermal communication therewith. The heating elements 142 heat gases flowing through the injector 66. The first injector 66 may also have one or more cooling elements (FIGS. 10 and 11) in thermal communication therewith for cooling the gases flowing through the injector.

Referring to FIGS. 1, 5 and 8, the CVD reactor also preferably includes a second reactant gas injector 68 secured to the flow flange 46. Similar to the first injector 66, the second gas injector 68 is releasably secured to the flow flange 46 so that it may be easily removed from the flow flange 46 and replaced with another gas injector without breaking the air-tight seal between the flow flange 46 and the chamber 22 and/or without entering the interior region 28 of the chamber 22. The second reactant gas injector 68 preferably includes three separate and independent sections, each section having an input port 144A–144C at a top portion of the gas injector 68 and an outlet port 146A–146C at the bottom of the gas injector. In other words, when the injector 68 is secured to the CVD reactor 20, the input ports 144A–144C are accessible at the exterior portion 30 of the chamber 22 and the output ports 146A–146C are disposed in the interior region 28 of the chamber. A deflector plate 148 for deflecting the reactant gas exiting from the outlet ports 146A–146C may be secured adjacent the outlet ports for deflecting the reactant gas across the growth area 44. The deflector plate 148 is preferably secured in place using a securing element 150, such as one or more screws or clamps, so that the deflector plate 148 may be easily detached from the bottom of the second gas injector 68, if necessary. In certain embodiments, the deflector plate 148 may be removed and replaced with another deflector plate 148 when it is desirable to modify the gas flow exiting from the outlet ports 146A–146C. The deflector plate 148 is preferably designed so that the reactant gas flowing from the first outlet port 146A is directed toward the center of the growth area 44, the flow from the second outlet port 146B is directed toward the radial middle of the growth area and the flow from the third outlet port 146C is directed toward the outer periphery of the growth area 44. As such, the introduction of the reactant gases into the interior region 28 of the chamber 22 and the nature of the reactions which occur at the growth area 44 may be controlled so as to generate the growth of epitaxial layers on wafers having preferred characteristics.

As shown in FIG. 1, the reactant gases exiting from the outlet ports 146A-146C of the second gas injector 68 are introduced into the interior region 28 of the chamber 22 at a distance from the growth area 44, designated $d_1$, which is relatively small. In contrast, the reactant gases from the first gas injector 66 are introduced into the interior region 28 of the chamber 22 at a distance from the growth area, designated $d_2$, which is relatively large. This particular design allows the reactant gases introduced by the respective injectors 66 and 68 to be maintained separate and apart from one another until the gases chemically interact at a position relatively close to the growth area 44. For certain combinations of reactant gases, this improves the quality of the chemical reaction which occurs at the growth area. If the first and second injectors 66 and 68 were identical in design so that the reactant gases therefrom were introduced into the interior region of the chamber at the same distance above the growth area, then the gases would tend to interact prematurely. As a result, the ensuing chemical combination would degrade before reaching the growth area 44, resulting in the growth of defective epitaxial layers. On the other hand, it is also critical that the reactant gases have enough time to chemically interact with one another before reaching the growth area. For example, if the outlet ports 146A–146C for the second gas injector 68 are positioned directly above the growth area 44, then the reactant gases from the second gas injector 68 may not have sufficient time to fully interact with the reactant gases from the first gas injector 66 prior to reaching the growth area 44, thereby resulting in the growth of inferior epitaxial layers.

Figure 9A:
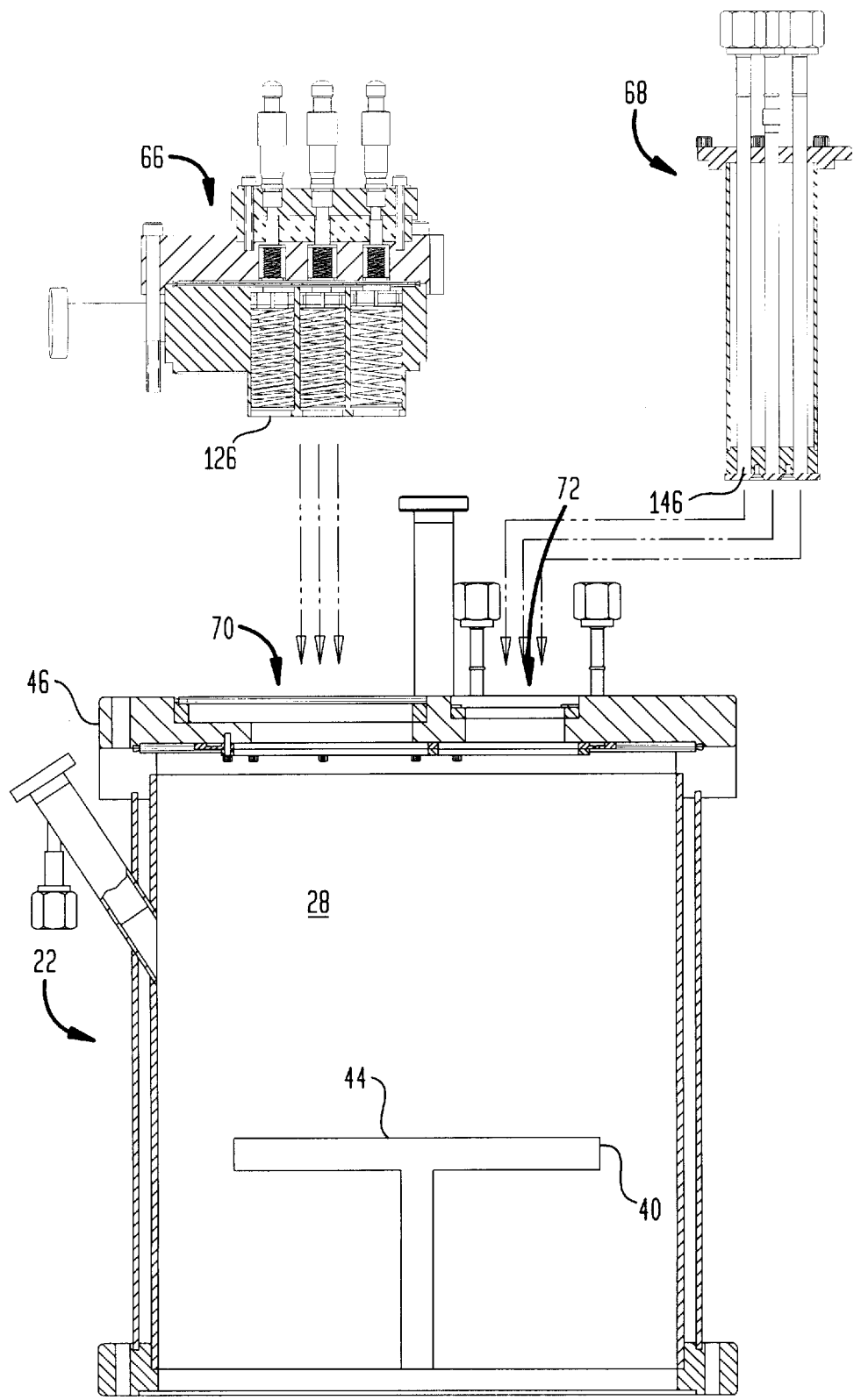
FIG. 9A shows a cross-sectional view of a CVD reactor immediately before gas injectors are inserted in openings extending through a flow flange in accordance with certain preferred embodiments of the present invention.
Figure 9B:
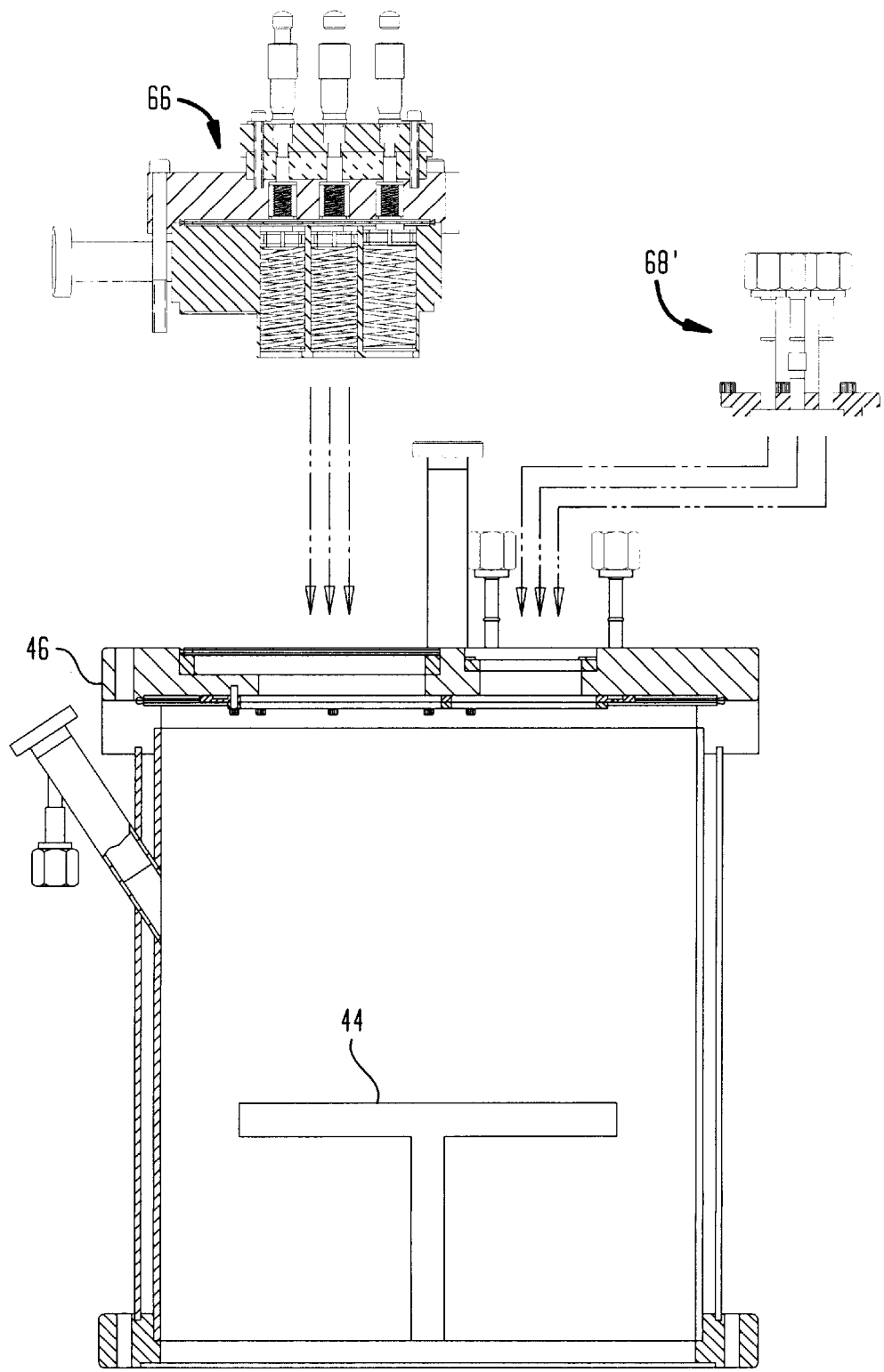
FIG. 9B shows a cross-sectional view of a CVD reactor immediately before gas injectors are inserted in openings extending through a flow flange in accordance with further preferred embodiments of the present invention.
Figure 9C:
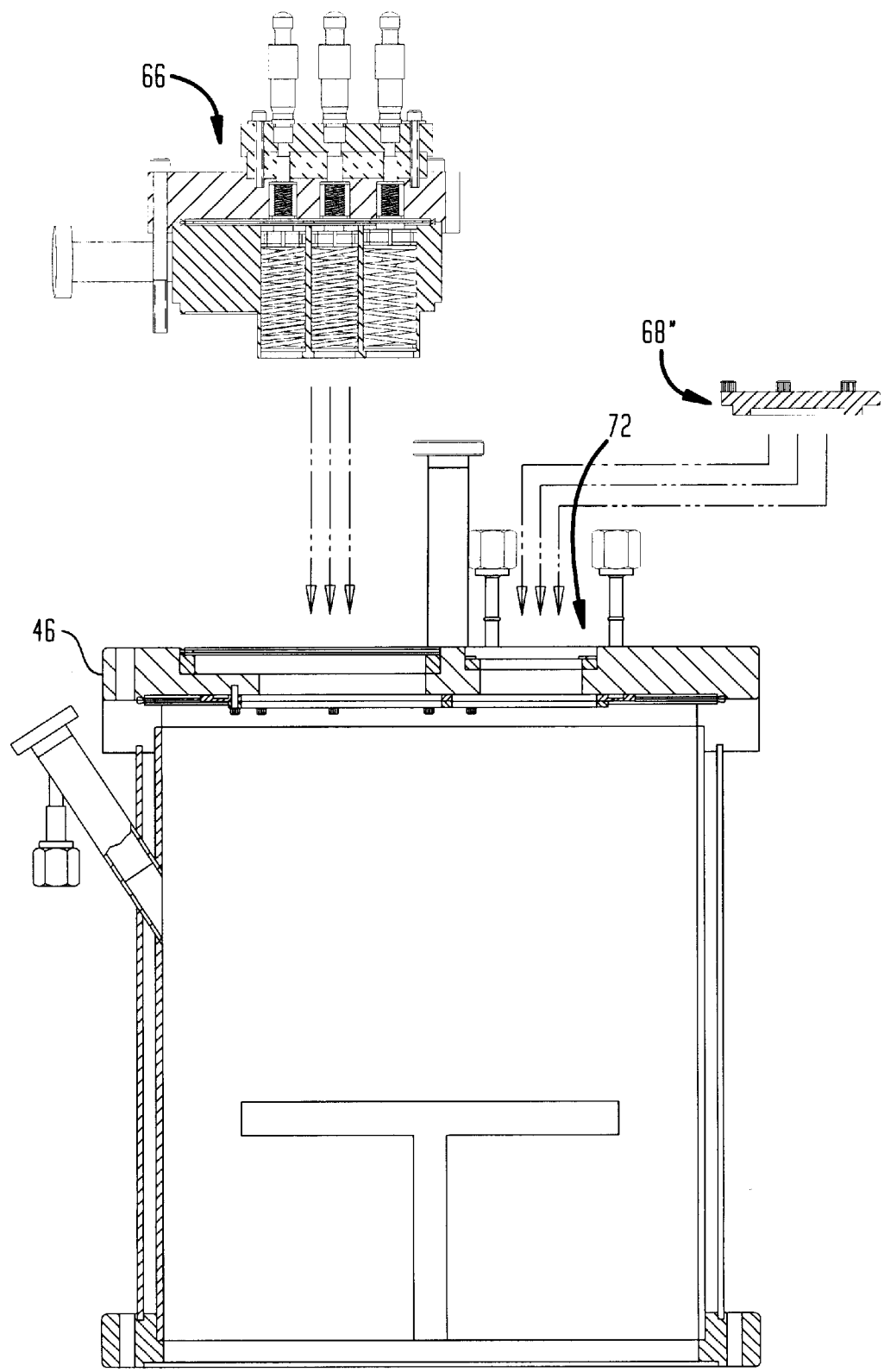
FIG. 9C shows a cross-sectional view of a CVD reactor immediately before one or more gas injectors are inserted in openings extending through a flow flange in accordance with still further preferred embodiments of the present invention.

As shown in FIGS. 9A–9C, preferred embodiments of the present invention provide an adjustable flow flange 46 having one or more reactant gas injectors 66 and 68 which are releasably secured to the flow flange so that flow paths for reactant gases may be readily modified by removing one gas injector which introduces the gas at a first distance from the growth area and replacing it with a second gas injector which introduces the gas at a different distance from the growth area. These particular design features are especially valuable for research and development efforts seeking to determine the optimum flow paths to use for growing epitaxial layers.

As shown in FIG. 9A, the first gas injector 66 and the second gas injector 68 are adapted for being releasably secured through respective apertures 70 and 72 in flow flange 46. Upon being secured to the flow flange 46 the outlet ports 146 of the second gas injector 68 are relatively closer to the growth area than the outlet ports 126 of the first injector 66. Reactant gases may then be introduced into the interior region 28 of the chamber 22 through the first and second gas injectors. If analysis of the epitaxial layers indicates that the layers do not satisfy established standards then either the first or the second gas injector may be removed from the flow flange 46 and replaced with another gas injector having a different design. For example, FIG. 9B shows a replacement gas injector 68' which replaces the second gas injector 68 shown in FIG. 9A. As shown in FIG. 9B, the replacement gas injector 68' does not extend as far into the interior region of the chamber as does the second gas reactor 68 of FIG. 9A. As such, the flow path of the reacting gas from the replacement gas injector 68' is different than the flow path created by the second gas injector 68 of FIG. 9A. As a result, the reactant gases from the first gas injector 66 and the replacement gas injector 68' of FIG. 9B will chemically interact with one another earlier than do the reactant gases in the embodiment shown in FIG. 9A. This earlier chemical reaction will change the nature of the epitaxial layer formed at the growth area. Thus, as shown in FIGS. 9A and 9B, researchers may easily modify the flow paths of the reactive gases in order to change the quality of the epitaxial layers grown on wafers. The adjustable nature of the flow flange allows operators to rapidly change the gas injectors, thereby providing a dramatic improvement over prior art CVD reactors in which changing the gas injectors is a lengthy and time consuming process.

Referring to FIG. 9C, in certain instances it may be necessary to completely close one of the complex apertures 72 in the flow flange 46 whereupon no reacting gases may be introduced through that particular complex aperture. As shown in FIG. 9C, a covering plate 68" replaces the second gas injector 68 shown in FIG. 9A. The covering plate 68" forms an air-tight seal with the complex aperture 72 associated therewith. The covering plate 68" has no input ports for receiving reacting gases so that no reactant gases are introduced into the interior region of the chamber through the second complex opening. However, reactant gases may still be introduced through the first gas injector 66.

The preferred embodiments of the CVD reactor disclosed herein may be used to grow a broad range of epitaxial layers over wafers. These include such Group III-V compound semiconductors as GaAs, GaP, $GaAs_{1-x}P_x$, $Ga_{1-y}Al_yAs$, $Ga_{1-y}In_yAs$, AlAs, InAs, InP, InGaP, InSb, GaN, InGaN, and the like. However, the CVD reactors disclosed herein may also be utilized to produce other compounds. These include Group II-VI compounds, such as ZnSe, CdTe, HgCdTe, CdZnTe, CdSeTe, and the like; Group IV-IV compounds, such as SiC, diamond, and SiGe; as well as oxides, such as YBCO, BaTiO, $MgO_2$, ZrO, SiO2, ZnO and ZnSiO; and metals, such as Al, Cu and W. Furthermore, the resultant materials will have a wide range of electronic and optoelectronic applications, including high brightness light emitting diodes (LED's), lasers, solar cells, photocathodes, HEMT's and MESFET's.

Figure 11:
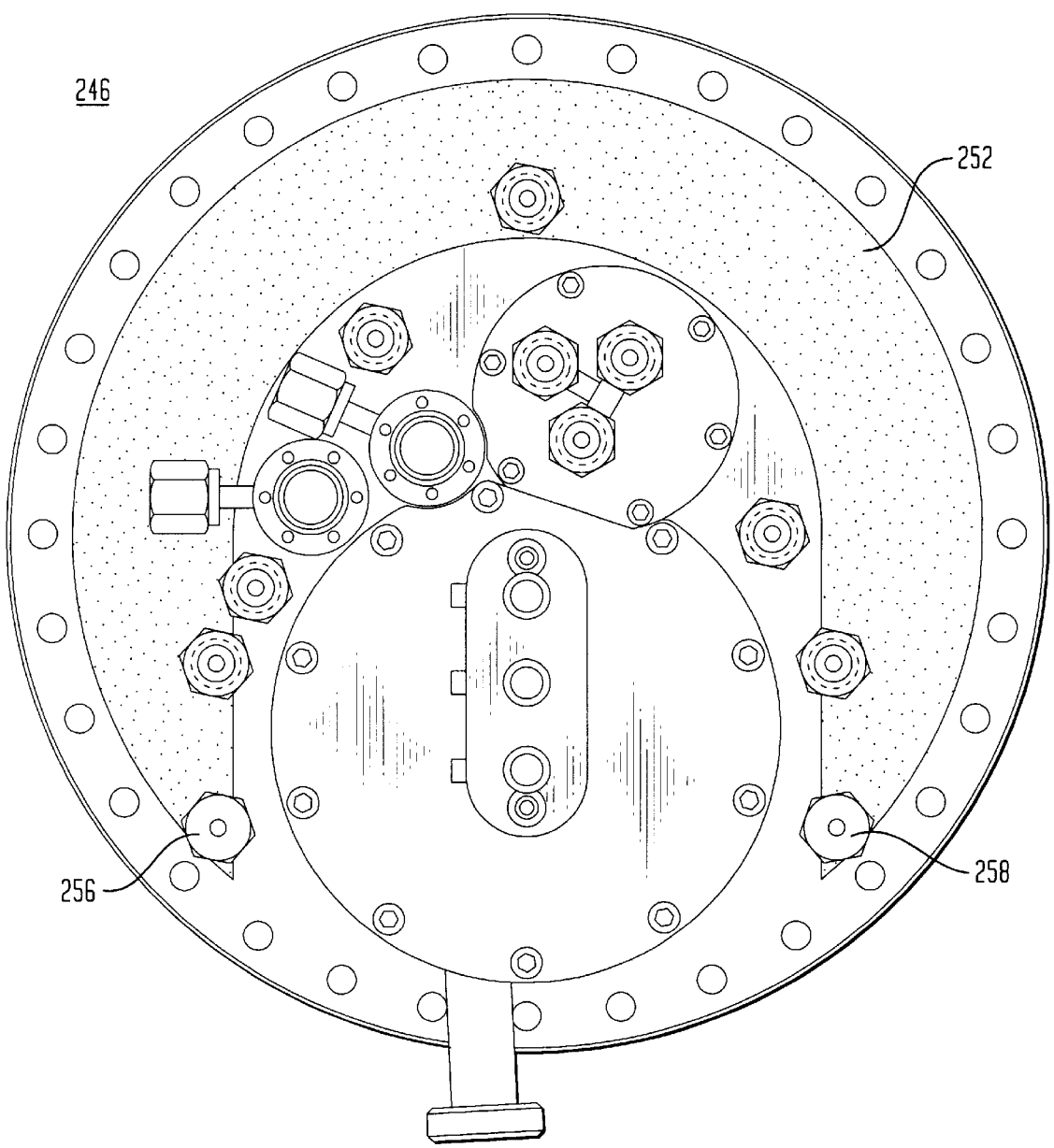
FIG. 11 shows a bottom view of FIG. 10.

Referring to FIGS. 10 and 11, certain preferred embodiments of the CVD reactor include a cooling element 252, such as a water jacket, provided in fluid communication with one or more of the reactant gas injectors 266 and 268 for cooling reactant gases passed through the injectors and introduced into the interior region of the chamber. In these preferred embodiments, the flow flange 246 includes a hollow portion 254 formed therein and a cooling jacket 252 fitted within the hollow portion 254. A cooling fluid, such as water, may be provided in the cooling jacket 252. As shown in FIG. 11, the cooling jacket 252 includes a fluid input port 258 for introducing the cooling fluid into the jacket 252 and a fluid output port 258 for removing cooling fluid from the jacket 252. The jacket 252 may be flushed clean and replaced with new cooling fluid by removing degraded cooling fluid from the output port 258 and adding new cooling fluid into the jacket 252 through the input port 256.

Figure 12:
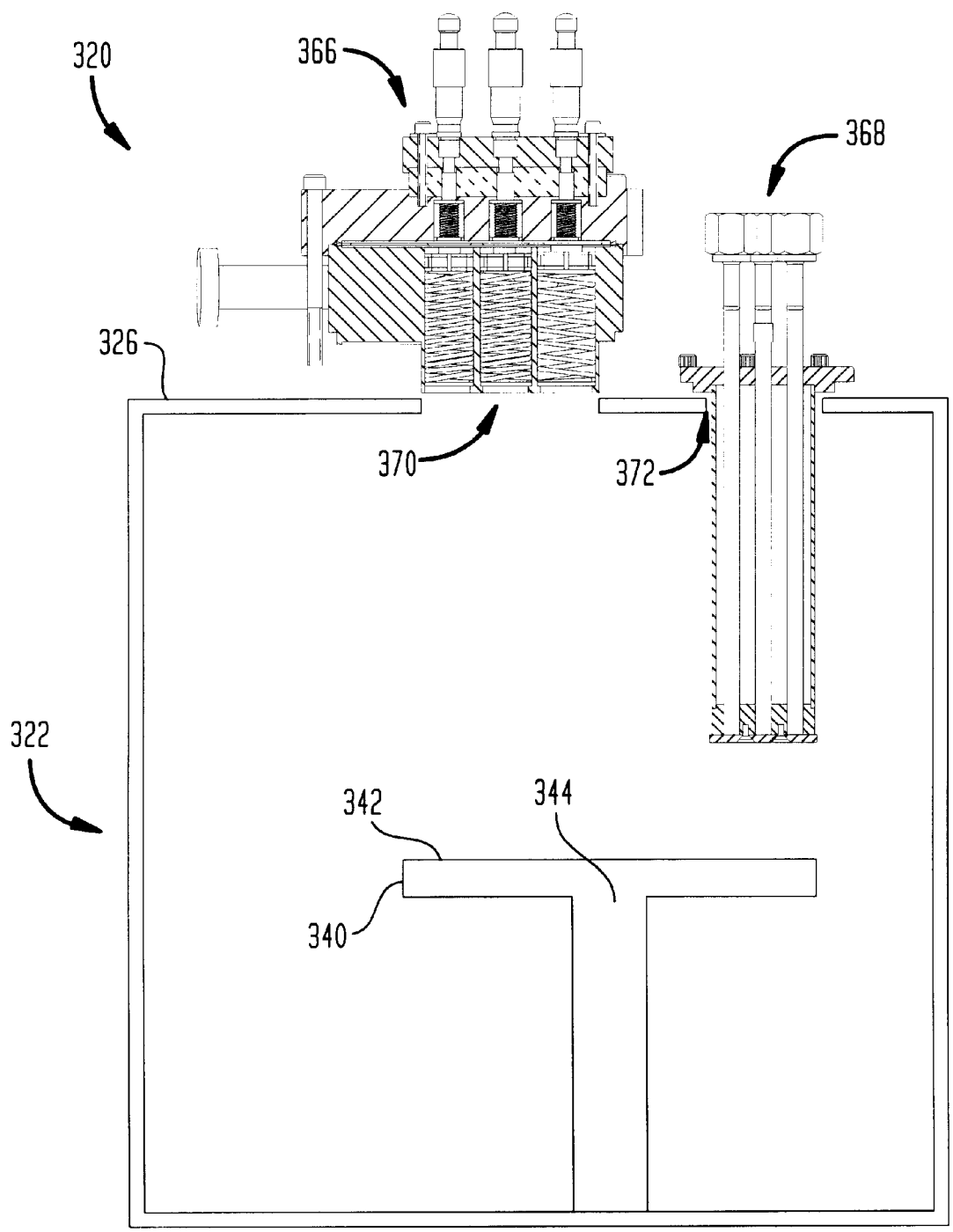
FIG. 12 shows a cross-sectional view of a CVD reactor including gas injectors secured thereto in accordance with still further preferred embodiments of the present invention.

As shown in FIG. 12, certain preferred embodiments of the CVD reactor 320 do not include an adjustable flow flange as described above. In these particular embodiments, the reactive gas injectors 366 and 368 are secured directly to apertures extending through the walls 326 of the vacuum chamber. The chamber includes a substrate carrier 340 having a growth area 344 at a top surface 342 thereof. First and second reactant gas injectors 366 and 368 are releasably secured through respective apertures 370 and 372 and above the substrate carrier 340. The releasably secured gas injectors 366 and 368 may be easily replaced with other reactant gas injectors to modify the flow paths of the reactant gases.

Figure 13:
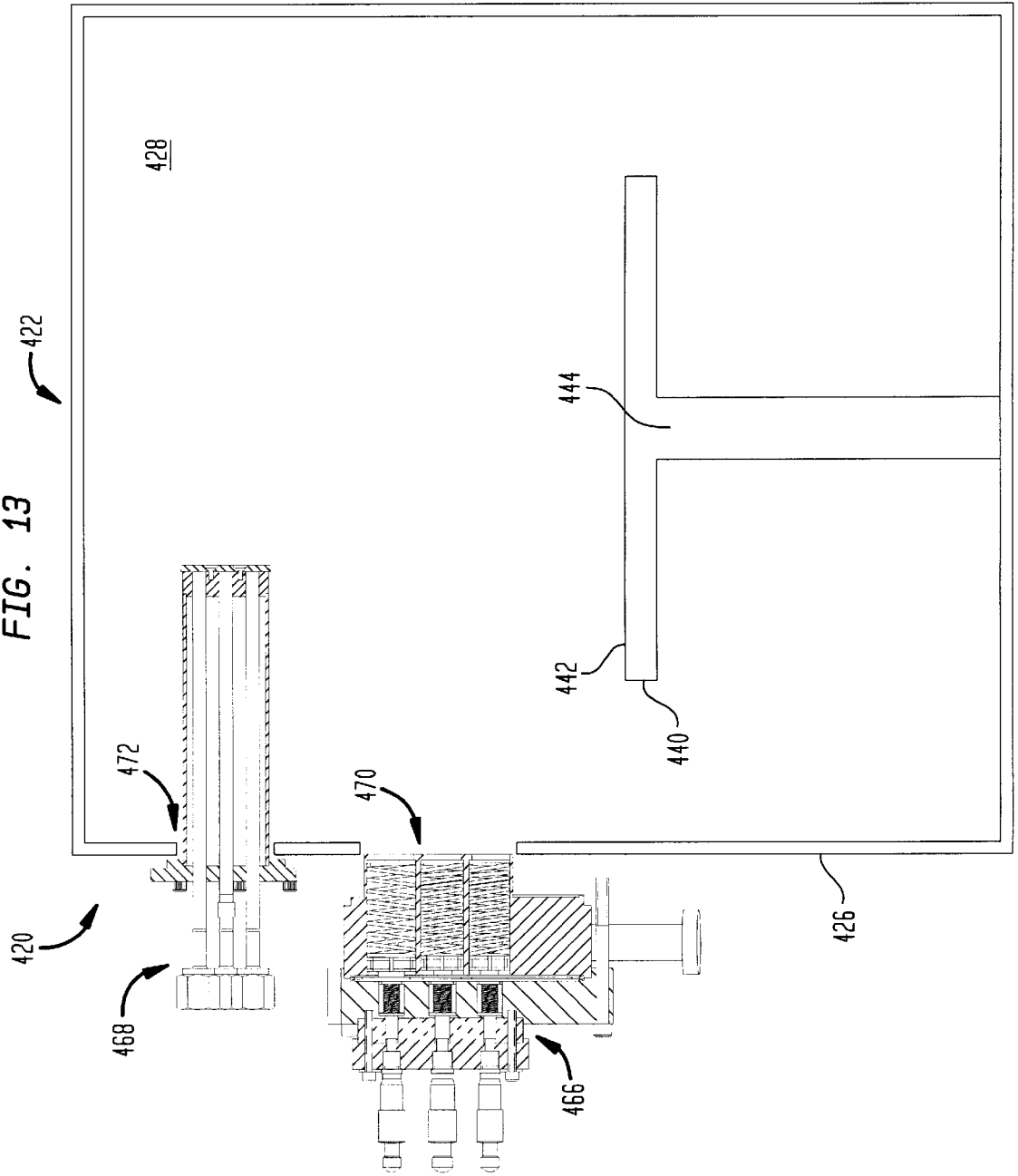
FIG. 13 shows a cross-sectional view of a CVD reactor including gas injectors secured to a side wall of the reactor in accordance with yet further embodiments of the present invention.

FIG. 13 shows yet another embodiment of the present invention in which the reactant gas injectors 466 and 468 are secured to a side wall 426 of the vacuum chamber 422 so that the gas injectors 466 and 468 do not directly overlie the growth area 444 on the first surface 442 of the substrate carrier 440. In the particular embodiment shown in FIG. 13, the chamber 422 has a side wall 426 with apertures 470 and 472 for receiving reactant gas injectors 466 and 468, respectively. The reactant gas injectors 466 and 468 are releasably secured to the side wall 426 and form an air-tight seal with the vacuum chamber 422. During operation, wafers are placed atop the growth area 444 of the substrate carrier 440 and, while the substrate carrier is rotated, reactant gases are introduced into the interior region 428 of the chamber 420 through the gas injectors 466 and 468. In the particular embodiment shown in FIG. 13, the substrate carrier 440 rotates in a substantially horizontal plane. However, in other embodiments the substrate carrier may rotate in a substantially vertical plane or anywhere between a horizontal and vertical plane.

Figure 14:
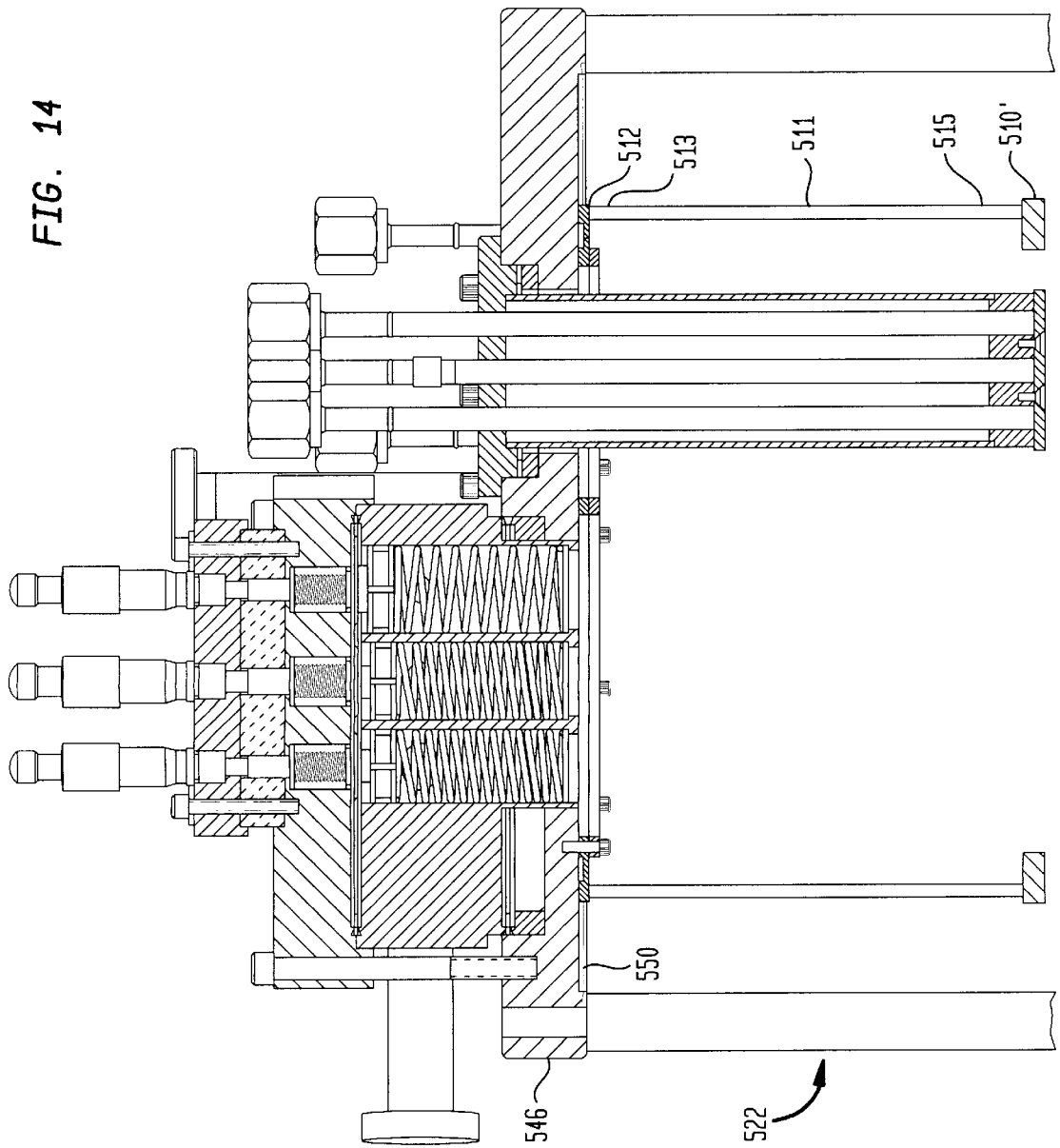
FIG. 14 shows a fragmentary cross-sectional view of a CVD reactor including a carrier gas curtain in accordance with still further preferred embodiments of the present invention.

Referring to FIG. 14, in yet further embodiments, the curtain gas ring 510 secured to the bottom surface 550 of the flow flange 546 may include a second curtain gas ring 510' provided directly below and concentric with the first curtain gas ring 510 and a tubular mesh screen second end 515 connected to the second curtain gas ring 510'. The tubular mesh screen 511 provides additional protection for shielding the interior walls of the chamber 522 from reactant gases.

As will be appreciated, numerous variations and combinations of the features discussed above may be utilized without departing from the present invention as further defined by the claims. Accordingly, the foregoing description of the preferred embodiment should be taken by way of illustration rather than by way of limitation of the invention.

What is claimed is:

1. A chemical vapor deposition reactor comprising:
    a chamber including one or more walls defining an interior region and an exterior region of said chamber, said one or more walls including one or more apertures extending therethrough for passing reactant gasses from the exterior region of said chamber to the interior region of said chamber;
    one or more reactant gas injector modules including an injector base releasably secured to said one or more apertures and one or more passageways affixed to said injector base for passing said reactant gas into the interior region of said chamber; and
    one or more sealing elements provided in said one or more apertures for forming an airtight seal between said one or more reactant gas injector modules and said one or more apertures whereby said one or more reactant gas injector modules is adapted for being selectively unsecured from said one or more apertures without entering the interior region of said chamber.

2. The reactor as claimed in claim 1, wherein each said reactant gas injector module includes an input port accessible at the exterior region of said chamber adapted for receiving one or more gasses and an output port adapted for being positioned within the interior region of said chamber for introducing gas into the interior region of said chamber.

3. The reactor as claimed in claim 1, further comprising a substrate carrier mounted within the interior region of said chamber.

4. The reactor as claimed in claim 3, wherein said substrate carrier includes a rotatable disk mounted for rotation within the interior region of said chamber.

5. The reactor as claimed in claim 4, wherein said rotatable disk is mounted for rotation within a substantially horizontally plane.

6. The reactor as claimed in claim 3, wherein said substrate carrier includes a first surface having a growth area facing toward said one or more reactant gas injector modules.

7. The reactor as claimed in claim 6, wherein said gas injector modules overlie the first surface of said carrier substrate.

8. The reactor as claimed in claim 6, wherein the growth area of said substrate carrier is adapted for receiving one or more wafer-sized substrates.

9. The reactor as claimed in claim 8, wherein said reactant gas injector modules include a first injector module overlying a first region of said growth area and a second injector overlying a second region of said annular growth area.

10. The reactor as claimed in claim 9, wherein said first injector module at least partially overlies a central region of said growth area and said second injector module at least partially overlies a peripheral region of said growth area.

11. The reactor as claimed in claim 10, wherein said reactant gas injector modules include a first injector module adapted for introducing a gas at a first distance from the growth area of said carrier substrate; and a second injector adapted for introducing a gas at a second distance from the growth area of said carrier substrate, the first and second distances being unequal.

12. The reactor as claimed in claim 11, wherein the second gas injector module includes one or more output channels which project into the interior region of said chamber.

13. The reactor as claimed in claim 3, wherein said one or more reactant gas injector modules are adapted for introducing a first gas into the interior region of said chamber at a first distance from said substrate carrier and a second gas into the interior region of said chamber at a second distance from said substrate carrier, said first and second distances being unequal to one another.

14. The reactor as claimed in claim 1, wherein at least one of said walls includes a base flange having said one or more apertures extending therethrough.

15. The reactor as claimed in claim 1, further comprising a heating element in thermal communication with said gas injector modules for selectively heating one or more of said reactant gasses.

16. The reactor as claimed in claim 1, further comprising a cooling element in thermal communication with said gas injector modules for selectively cooling one or more of said reactant gasses.

17. The reactor as claimed in claim 14, wherein said base flange is secured to at least one of said walls of said chamber.

18. The reactor as claimed in claim 1, wherein said sealing element includes a flexible gasket.

19. The reactor as claimed in claim 1, wherein said sealing element includes one or more knife edges.

20. The reactor as claimed in claim 14, wherein said base flange is permanently secured to at least one of said walls of said chamber.

21. The reactor as claimed in claim 14, wherein said base flange is releasable secured to at least one of said walls of said chamber.

22. The reactor as claimed in claim 14, wherein said chamber defines a substantially cylindrical body having a circular opening at a top portion thereof and said base flange includes a disk-shaped portion having an outer periphery which substantially conforms to the shape of said circular opening.

23. The reactor as claimed in claim 22, wherein said sealing element includes a peripheral groove formed in a surface of said base flange and a flexible sealing gasket fitted in said peripheral groove.

24. The reactor as claimed in claim 23, wherein said peripheral groove has an annular configuration and said flexible sealing gasket includes an O-ring.

25. The reactor as claimed in claim 14, wherein said base flange includes a metallic disk.

26. The reactor as claimed in claim 19, wherein said base flange includes a hollow portion therein.

27. The reactor as claimed in claim 26, further comprising a jacket fitted in said hollow portion of said base flange, wherein said jacket is adapted for containing a cooling fluid.

28. The reactor as claimed in claim 14, wherein said base flange includes an exterior surface facing the exterior region of said chamber and an interior surface facing the interior region of said chamber, said base flange having a peripheral groove formed in the interior surface thereof, said one or more sealing elements fitted therein.

29. The reactor as claimed in claim 28, wherein at least one of said one or more apertures comprises:

a first opening at the exterior surface of said base flange, said first opening having a diameter and extending partially through said base flange toward the interior surface thereof, said first opening terminating at a bottom located between the exterior and interior surfaces of said base flange; and a second opening formed in the bottom of said first opening and extending to the interior surface of said base flange, said second opening having a second diameter which is smaller than the diameter of said first opening.

30. A chemical vapor deposition reactor comprising:

a chamber having one or more walls defining an interior region and an exterior region of said chamber, the one or more walls including one or more apertures therein extending from the exterior region to the interior region of said chamber;

a substrate carrier mounted with the interior region of said chamber;

one or more reactant gas injector modules including an injector base releasably secured to said one or more apertures extending through the walls of said chamber, and one or more sealing elements provided in said one or more apertures for forming an air-tight seal between said one or more reactant gas injector modules and said one or more apertures, each said injector module having one or more passageways for introducing reactant gas through one of said apertures and into the interior region of said chamber, wherein said reactant gas injector modules are adapted for introducing a first gas at a first distance form said substrate carrier and a second gas at a second distance from said substrate carrier, the first and second distances being unequal.

31. The reactor as claimed in claim 30, wherein at least one of said injectors is adapted for being selectively unsecured from said chamber without accessing the interior region of said chamber.

32. The reactor as claimed in claim 31, wherein each said reactant gas injector includes an input port accessible at the exterior region of said chamber adapted for receiving one or more gasses and an output port adapted for being positioned within the interior region of said chamber for introducing gas into the interior region of said chamber.

33. The reactor as claimed in claim 1, wherein said one or more apertures include a first aperture comprising:

a first opening extending from the exterior region of said chamber and partially through said wall toward the interior region of said chamber, said first opening having a diameter and terminating in said wall at a bottom located between the exterior region and the interior region of said chamber; and a second opening formed in the bottom of said first opening and extending to the interior region of said chamber, said second opening having a second diameter, wherein the diameter of said first opening is greater than the diameter of said second opening.

* * * * *

UNITED STATES PATENT AND TRADEMARK OFFICE
CERTIFICATE OF CORRECTION

PATENT NO. : 6,080,241
DATED : June 27, 2000
INVENTOR(S) : Li et al.

It is certified that error appears in the above-identified patent and that said Letters Patent is hereby corrected as shown below:

Col. 12, line 11, after "screen" insert --511 having a first end 513 connected to the first curtain gas ring 510 and a--.

Col. 12, line 60, after "said" insert --reactant--.

Col. 13, line 1, after "injector" insert --module--.

Col. 13, line 11, after "injector" insert --module--.

Col. 13, line 61, "19" should read --14--.

Signed and Sealed this

Tenth Day of April, 2001

*Attest:*

NICHOLAS P. GODICI

*Attesting Officer*     *Acting Director of the United States Patent and Trademark Office*